(12) United States Patent
Eng

(10) Patent No.: US 9,343,531 B2
(45) Date of Patent: May 17, 2016

(54) FIELD EFFECT TRANSISTOR AND METHOD FOR FABRICATING FIELD EFFECT TRANSISTOR

(71) Applicant: UNITED MICROELECTRONICS CORP., Hsin-Chu (TW)

(72) Inventor: Yi Chuen Eng, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/455,947

(22) Filed: Aug. 11, 2014

(65) Prior Publication Data

US 2016/0013272 A1     Jan. 14, 2016

(30) Foreign Application Priority Data

Jul. 11, 2014   (CN) .......................... 2014 1 0329243

(51) Int. Cl.
*H01L 27/148* (2006.01)
*H01L 29/10* (2006.01)
*H01L 29/78* (2006.01)
*H01L 29/66* (2006.01)

(52) U.S. Cl.
CPC ...... *H01L 29/1033* (2013.01); *H01L 29/66477* (2013.01); *H01L 29/78* (2013.01)

(58) Field of Classification Search
CPC .................... H01L 29/1033; H01L 21/823412
USPC ............................ 257/213, 240, 286; 438/142
See application file for complete search history.

(56) References Cited

U.S. PATENT DOCUMENTS

| 5,286,664 | A | 2/1994 | Horiuchi |
| 6,555,437 | B1 | 4/2003 | Yu |
| 7,943,986 | B2 * | 5/2011 | Yang ................. H01L 29/66795 257/328 |
| 8,269,278 | B2 | 9/2012 | Lin |
| 2005/0110039 | A1 * | 5/2005 | Chi ...................... H01L 29/0696 257/178 |

OTHER PUBLICATIONS

Eng, "Numerical Study of a Highly Scaled Bulk MOSFET with Block Oxide and Source/Drain-Tied Structure", IEEE Transactions on Electron Devices, vol. 58, No. 5, May 2011, Apr. 5, 2011.
Lin, "Additional-Body Effects in a Self-Aligned Deca-Nanometer Ultrathin-Body and Buried Oxide Silicon-on-Insulator Metal-Oxide-Semiconductor Field-Effect Transistor: A Three-Dimensional Simulation Study", Japanese Journal of Applied Physics 50 (2011) 110210, Nov. 1, 2011.

* cited by examiner

*Primary Examiner* — David Vu
*Assistant Examiner* — Brandon Fox
(74) *Attorney, Agent, or Firm* — Winston Hsu; Scott Margo

(57) ABSTRACT

A field effect transistor includes a substrate, an isolation layer, a gate, a channel, drain and a source. The substrate has an active region having a rectangular area and at least one protrusion protruded from the rectangular area. The isolation layer is formed on the substrate and encircling the active region. The gate crosses the active region and is formed above a middle portion of the active region. The channel is formed in the active region directly under the gate, extends to the at least one protrusion, and divides the active region into a first section and a second section. The drain formed in the first section and the source formed in the second section.

17 Claims, 6 Drawing Sheets

FIELD EFFECT TRANSISTOR AND METHOD FOR FABRICATING FIELD EFFECT TRANSISTOR

BACKGROUND OF THE INVENTION

1. Field of the Invention

This invention is related to a field effect transistor, especially related to a field effect transistor that can reduce short channel effect.

2. Description of the Prior Art

Generally, when the sizes of semiconductor devices are shrinking, the power consumption can be reduced and the response time can also be shortened relatively. Also, since the required material is reduced, extra manufacturing cost can also be saved. Therefore, how to shrink the sizes of semiconductor devices has always been an important topic when it comes to the development of semiconductor manufacturing. However, when the sizes of semiconductor devices are too small, for example, smaller than 90 nm, the short channel effect becomes more obvious. The drain induced barrier lowering, DIBL, caused by the short channel is one example of the short channel effect.

FIG. 1 shows a top view of the field effect transistor 100 according to a prior art. The field effect transistor 100 comprises the substrate 110, the drain 130, the source 140, the gate 150 and the channel 160. The substrate 110 includes the active region 120. The gate 150 is formed above the middle of the active region 120 and the channel 160 is formed directly under the gate 150. Because the channel 160 is placed directly under the gate 150, the boundaries of the channel 160 and the boundaries of the gate 150 are partly overlapping with each other as shown in FIG. 1. The channel 160 divides the active region 120 into two sections, the drain 130 and the source 140. Thus, the distance between the drain 130 and the source 140 is the length of the channel 160.

FIGS. 2 and 3 show the distributions of energy level among the source, the channel and the drain in the long channel field effect transistor 200 and the short channel field effect transistor 200' respectively. The structure of the long channel field effect transistor 200 in FIG. 2 and the structure of the short channel field effect transistor 200' in FIG. 3 are the same as the structure of the field effect transistor 100 in FIG. 1. The long channel field transistor 200 comprises the substrate 210, the drain 230, the source 240, the gate 250 and the channel 260 while the short channel field effect transistor 200' comprises the substrate 210', the drain 230', the source 240', the gate 250' and the channel 260'. The difference between these two transistors 200 and 200' is that the length of the channel 260 is longer than the length of the channel 260'. In addition, in FIGS. 2 and 3, the dotted lines represent the energy level of the drains 230 and 230' when there is no bias voltage applied and the solid line represent the energy gap of the drains 230 and 230' when the same bias voltages $V_d$ are applied. When there is no bias voltage applied on the drains 240 and 240', the energy levels of the channels 260 and 260' are higher than the energy levels of the sources 240 and 240' and the energy levels of the drain 230 and 230' for both the long channel field effect transistor 200 and the short channel field effect transistor 200'. Therefore, sufficient voltage must be provided to overcome the energy gap between the source 240 and the channel 260 and the energy gap between the source 240' and the channel 260' for transmitting the carriers from the sources 240 and 240' to the channels 260 and 260'.

Although the energy level of the channel 260 can be partly lowered when the bias voltage $V_d$ is applied on the drain 230, the energy level of the source 240 of the long channel field effect transistor 200 is not changed due to the longer length of the channel 260. That is, providing sufficient voltage is still necessary to overcome the energy gap between the source 240 and the channel 260 for transmitting the carriers from the source 240 to the channel 260. However, in the short channel field effect transistor 200', not only the energy level of the channel 260' is lowered, but also the energy gap between the source 240' and the channel 260' is lowered due to the short channel. The lowered energy gap makes it easier to transmit carriers into the channel 260' for the short channel field effect transistor 200', which also implies that, the leakage current is increased and the sub-threshold voltage can be changed with the bias voltage. In addition, it becomes harder to turn off the channel of the semiconductor device by the gate voltage when the sub-threshold swing increases.

Since the short channel effect can increase the leakage current and power consumption of the semiconductor devices and the sub-threshold swing can cause the difficulty of controlling the semiconductor devices, how to avoid the inconvenience caused by the short channel effect while shrinking the sizes of the semiconductor devices has become a critical issue to be solved.

SUMMARY OF THE INVENTION

One embodiment of the present invention discloses a field effect transistor. The field effect transistor comprises a substrate, an isolation layer, a gate, a channel, drain and a source. The substrate comprises an active region having a rectangular area and at least one protrusion protruded from the rectangular area. The isolation layer is formed on the substrate and encircles the active region. The gate crosses the active region and is formed above a middle portion of the active region. The channel is formed in the active region directly under the gate, extends to the at least one protrusion, and divides the active region into a first section and a second section. The drain formed in the first section and the source formed in the second section.

Another embodiment of the present invention discloses a field effect transistor. The field effect transistor comprises a substrate, an isolation layer, a gate, a channel, drain and a source. The substrate comprises an active region having a rectangular area and at least one protrusion protruded from the rectangular area, wherein corners of the rectangular area and corners of the at least one protrusion are rounded. The isolation layer is formed on the substrate and encircles the active region, wherein corners of the isolation layer are rounded. The gate crosses the active region and is formed above a middle portion of the active region. The channel is formed in the active region directly under the gate, extends to the at least one protrusion, and divides the active region into a first section and a second section. The drain is formed in the first section, and the source is formed in the second section.

Another embodiment of the present invention discloses a method of forming a field effect transistor. The method comprises providing a substrate, comprising an active region having a rectangular area and at least one protrusion protruded from the rectangular area; forming an isolation layer encircling the active region in the substrate; forming a gate crossing over the active region and on top of a middle of the active region; doping a plurality of carriers in a first section bounded by the gate and the isolation layer to form a drain in the first section and a second section bounded by the gate and the isolation layer to form a source in the second section.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
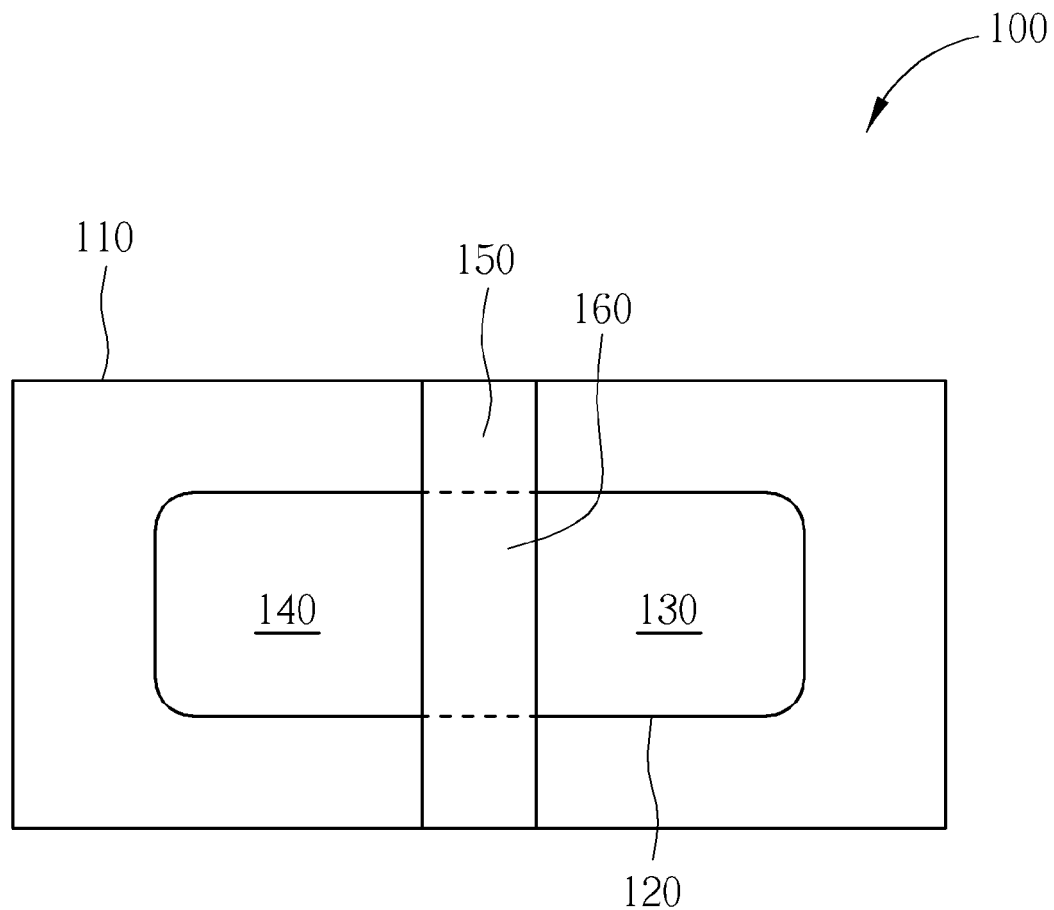
FIG. 1 shows a top view of a field effect transistor according to a prior art.
Figure 2:
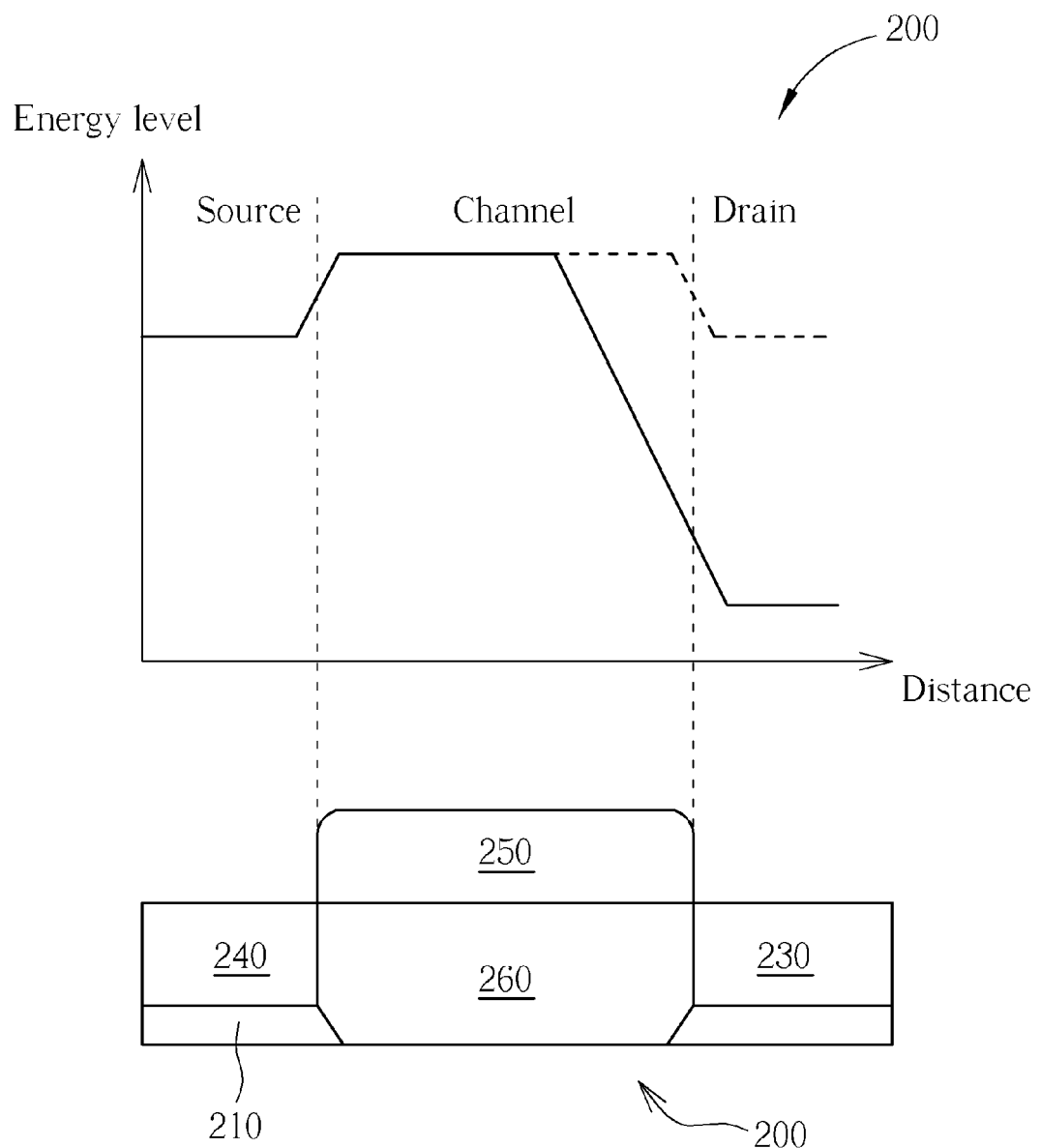
FIG. 2 shows distribution of energy level in a long channel field effect transistor according to a prior art.
Figure 3:
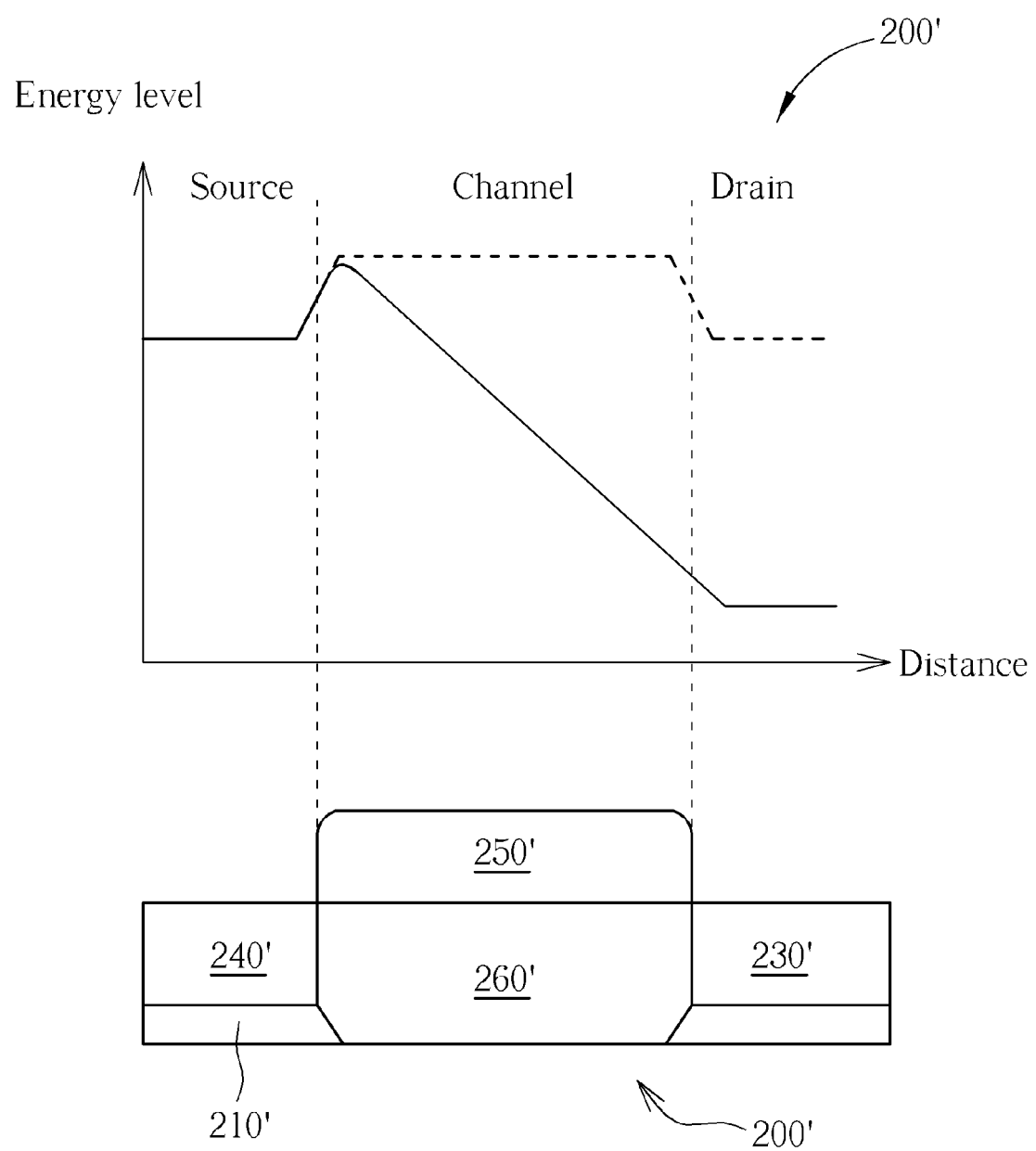
FIG. 3 shows distribution of energy level in a short channel field effect transistor according to prior art.
Figure 4:
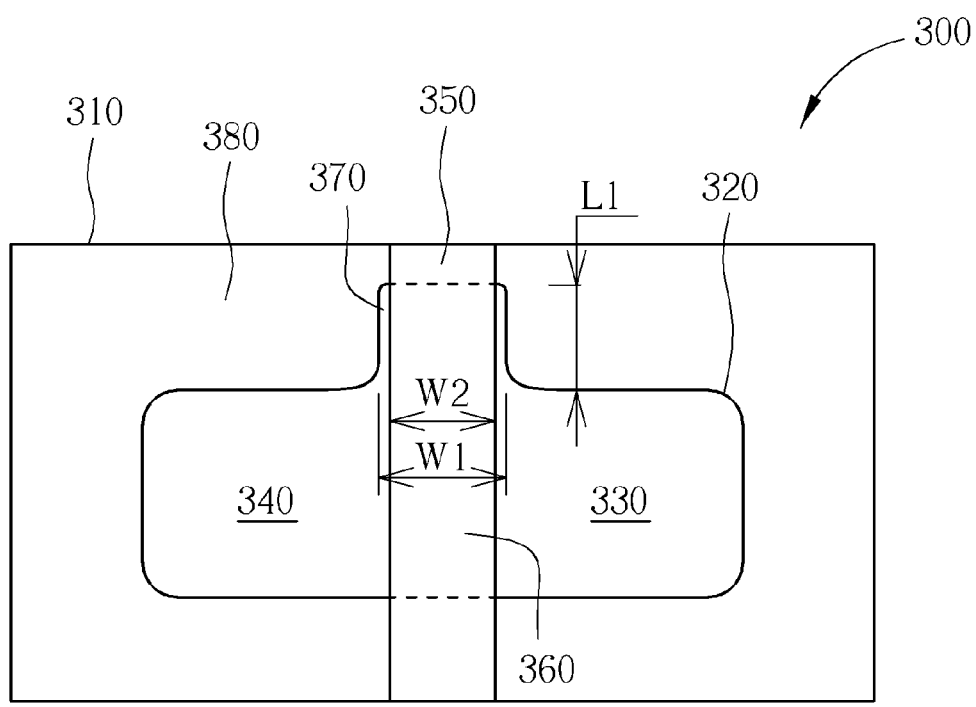
FIG. 4 shows a top view of a field effect transistor according to one embodiment of the present invention.

FIG. 4 shows the top view of a field effect transistor 300 according to one embodiment of the present invention. The field effect transistor 300 comprises a substrate 310, a drain 330, a source 340, a gate 350, a channel 360 and an isolation layer 380. The substrate 310 comprises an active region 320. The active region 320 has a rectangular area and a protrusion 370 protruded from the rectangular area, making the shape of the active region 320 as the letter "T". The isolation layer 380 is formed on the substrate 310 and encircles the active region 320. The gate 350 is formed above the middle portion of the active region 320 and the channel 360 is formed in the active region directly under the gate 350 and extending to the protrusion 370. Because the channel 360 is disposed directly under the gate 350, the boundaries of channel 360 and the boundaries of the gate 350 are partly overlapping with each other. The channel 360 further divides the active region 320 into a first section and a second section. The drain 330 is formed in the first section of the active region 320 and the source 340 is formed in the second section of the active region 320. The width between the drain 330 and the source 340 is the length of the channel 360 of the field effect transistor. Comparing to the active region 120 of the field effect transistor 100, the active region 320 further comprises the protrusion 370. The protrusion 370 can be free from doping any the carriers so the charges within the protrusion 370 are mainly controlled by the gate 350, which can help to reduce the short channel effect on the field effect transistor 300.

$$Q^* = Q_{dep}[1-(vol_s+vol_d)/vol_g] \quad (1)$$

Formula 1 explains relations between the charges within the equivalent depletion region $Q^*$ and the other parameters for a field effect transistor. The parameter $Q_{dep}$ represents the charges within the depletion region, the parameter $vol_s$ represents the volume with charges controlled by the source, the parameter $vol_d$ represents the volume with charges controlled by the drain, and the parameter $vol_g$ represents the volume with charges controlled by the gate in the field effect transistor. When there are more charges within the equivalent depletion regions, the gate can further enhance its control to the channel and the effects caused by the energy gap lowering can also be reduced. According to formula 1, when all the other conditions are not changed, the increase in the $vol_g$ can cause the increase in the charges within the equivalent depletion region $Q^*$. Therefore, the present invention adopts the extra protrusion 370 to enlarge the volume with charges controlled by the gate in the field effect transistor 300, and, thus, to reduce the short channel effect on the field effect transistor 300. Furthermore, since the field effect transistor 300 has more charges within the equivalent depletion region, the driving current of the field effect transistor 300 can be larger than the driving current of field transistor without protrusions when channels are turned on.

Consequently, the field effect transistor 300 can avoid the short channel effect on the short channel semiconductor device so the high power consumption caused by the leakage current can be reduced, the control difficulty caused by the sub-threshold swing can be eased and the strength of the driving current can be enhanced.

Figure 5:
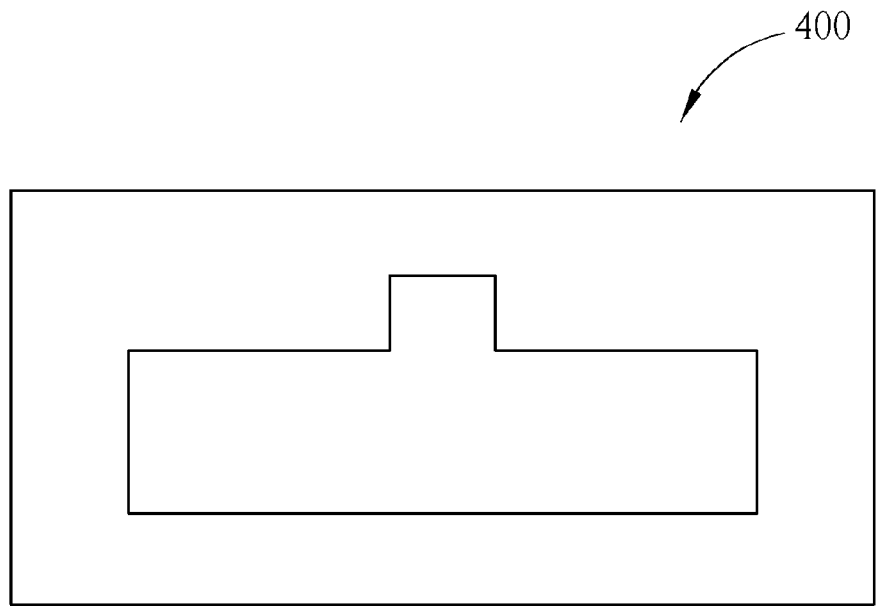
FIG. 5 shows a mask for the active region and the isolation layer of the field effect transistor in FIG. 4.

In addition, in FIG. 4, although the active region 320 has the protrusion 370 protruded from the rectangular area, the corners are not actually right angled but rounded. The reason is that the boundaries of active region 320, the protrusion 370 and the isolation 380 are defined by lithography and masks so the corners of the boundaries are hard to be patterned sharply and are easily rounded during the manufacturing procedure. Therefore, the corners of the active region 320 and the protrusion 370 are presented as mild smooth curves. However, as the manufacturing technology varies, the degree of the rounding effect can also be different so the shape of the protrusion 370 may comprises a rectangle and/or a bow. FIG. 5 shows the mask 400 used to define the boundaries of the active region 320 and the isolation layer 380. The shape of the mask 400 is as letter "T" and the corners are right angled.

In the semiconductor manufacturing process, another mask may be used to define the boundary of the gate 350 after the active region 320 and the isolation layer 380 are formed. In an ideal situation, the gate 350 should be formed directly above the protrusion 370 as shown in FIG. 4. In practical application, the gate 350 may be formed a little bit shifted to right or left of the position directly above the protrusion 370 during the lithography process. However, once the charges within the protrusion 370 are still controlled by the gate 350, the short channel effect can still be reduced effectively.

Furthermore, in FIG. 4, the width W1 and the length L1 of the protrusion 370 protruded from the active region 320 can be equal to the width W2 of the gate 350, however, the aforesaid embodiments are not to limit the present invention. By using masks with different shapes, the shapes and sizes of the protrusion 370 can also be varied. In another embodiment of the present invention, the width of the protrusion protruded from the active region can be one to two times the width of the gate. The greater protrusion can not only help to increase the volume with charges controlled by the gate in the active region, but also make it easier for the mask of the gate to align with the protrusion.

Figure 6:
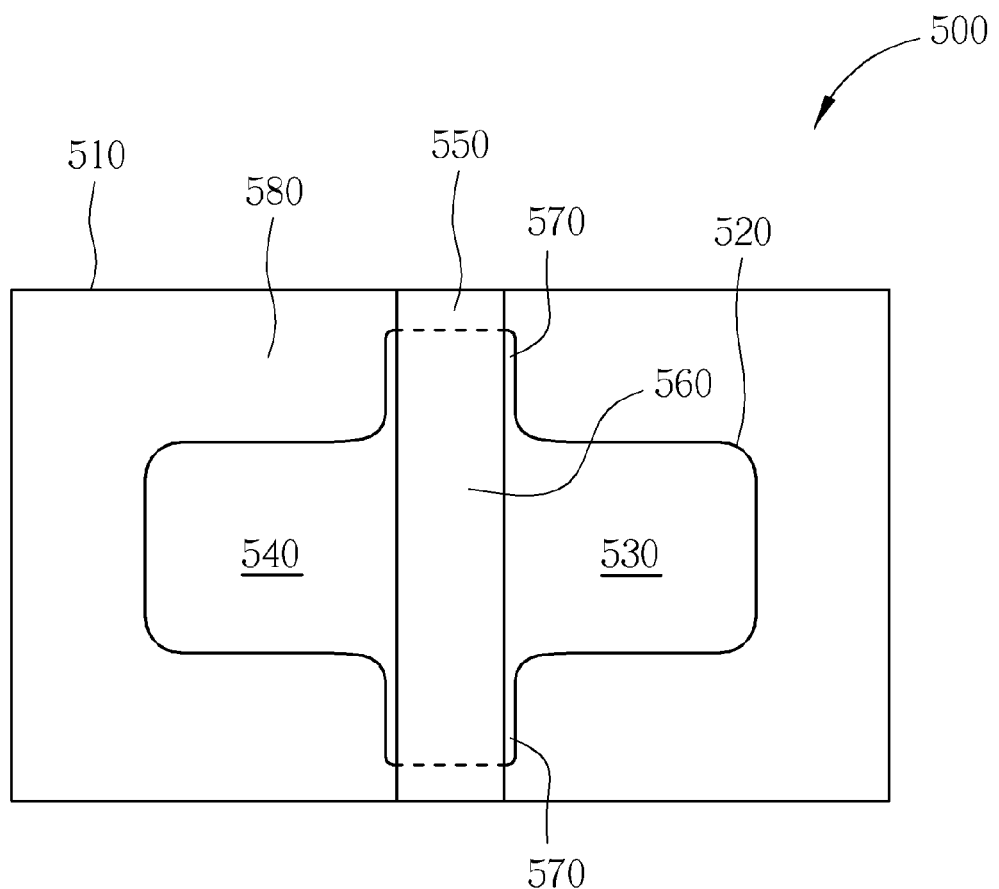
FIG. 6 shows a top view of a field effect transistor according to another embodiment of the present invention.

FIG. 6 shows the top view of a field effect transistor 500 according to another embodiment of the present invention. The field effect transistor 500 has a similar structure as the field effect transistor 300 does. The difference is that the active region 520 of field effect transistor 500 has a rectangular area and two protrusions 570 protruded from the rectangular. The two protrusions 570 protruded from the rectangular area from two opposite edges of the active region 520, making the shape of the active region 570 a symmetrical cross. Since the charges within the equivalent depletion region in the field effect transistor 500 are more than the charges within the equivalent depletion region in the field effect transistor 300, the field effect transistor 500 can suppress the short channel effect even more.

Figure 7:
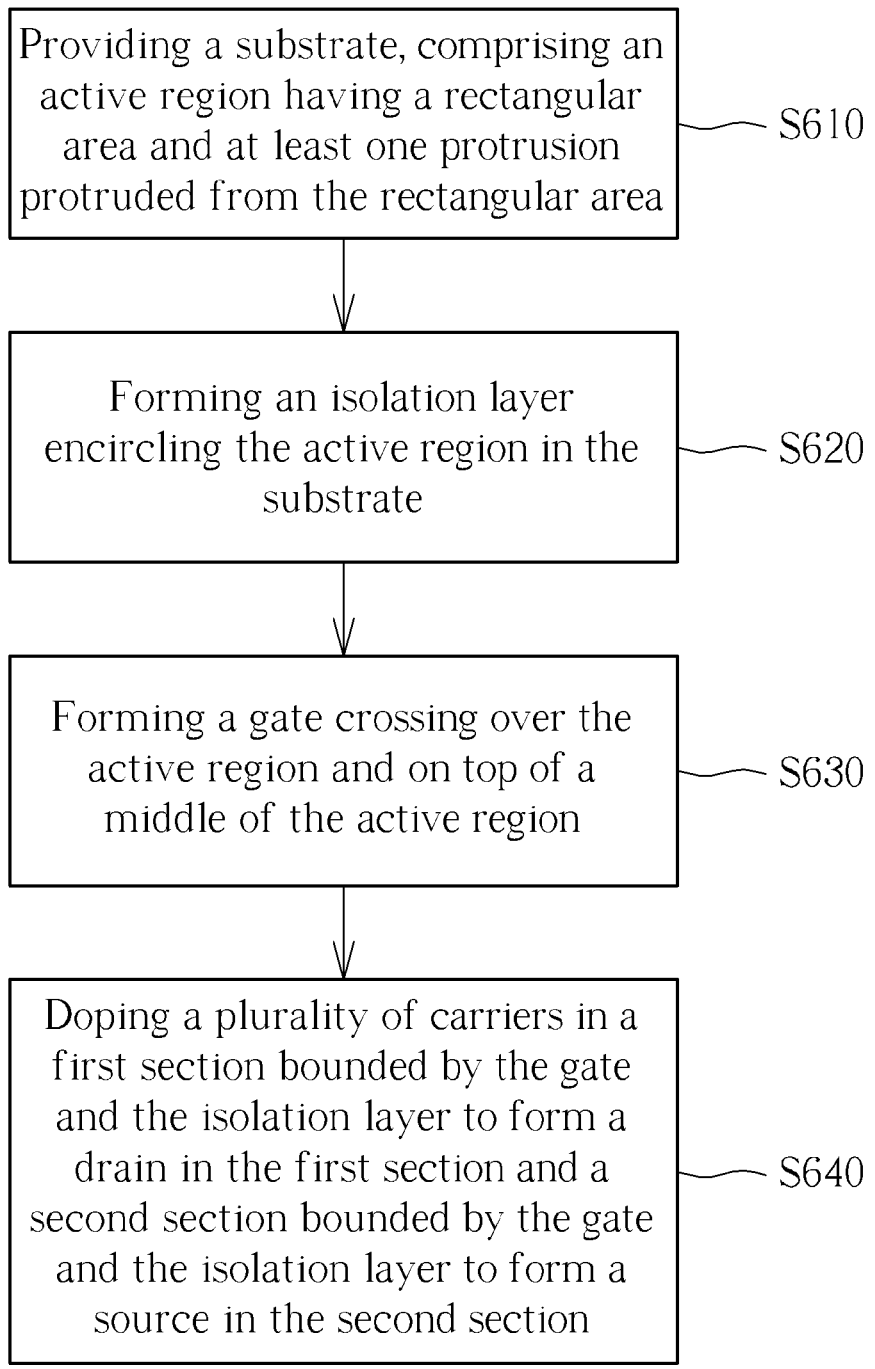
FIG. 7 shows a flowchart for a method of forming a field effect transistor according to one embodiment of the present invention.

FIG. 7 shows a flowchart for a method of forming a field effect transistor according to one embodiment of the present invention. The method includes the steps below:

S610: providing a substrate, comprising an active region having a rectangular area and at least one protrusion protruded from the rectangular area;

S620: forming an isolation layer encircling the active region in the substrate;

S630: forming a gate crossing over the active region and on top of a middle of the active region;

S640: doping a plurality of carriers in a first section bounded by the gate and the isolation layer to form a drain in the first section and a second section bounded by the gate and the isolation layer to form a source in the second section.

In summary, according to the embodiments of the present invention, the field effect transistor and the method of forming the field effect transistor can reduce the short channel effect on the short channel semiconductor devices so the high power consumption caused by the leakage current can be reduced, the control difficulty caused by the sub-threshold swing can be eased and the strength of the driving current can be enhanced. Furthermore, according to the embodiments of the present invention, the field effect transistor and the method of forming the field effect transistor do not require extra manufacturing processes but only modifying the pattern of the masks.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A field effect transistor comprising:
    a substrate comprising an active region having a rectangular area and at least one protrusion protruded from the rectangular area;
    an isolation layer formed on the substrate and encircling the active region;
    a gate crossing the active region and formed above a middle portion of the active region;
    a channel formed in the active region directly under the gate, extending to the at least one protrusion, and dividing the active region into a first section and a second section;
    a drain formed in the first section; and
    a source formed in the second section;
    wherein a minimum width of the protrusion is greater than a width of the gate.

2. The field effect transistor of claim 1, wherein a length of the protrusion protruded from the rectangular area is equal to the width of the gate.

3. The field effect transistor of claim 1, wherein the width of the protrusion is no greater than two times the width of the gate.

4. The field effect transistor of claim 1, wherein a shape of the protrusion comprises a rectangle and/or a bow.

5. The field effect transistor of claim 1, wherein the gate is formed directly above the at least one protrusion, or a little bit shifted to right or left of a position directly above the at least one protrusion.

6. The field effect transistor of claim 1, wherein the active region has two protrusions protruded from two opposite edges of the rectangular area, making a shape of the active region a symmetrical cross.

7. A method of forming a field effect transistor comprising:
    providing a substrate, comprising an active region having a rectangular area and at least one protrusion protruded from the rectangular area;
    forming an isolation layer encircling the active region in the substrate;
    forming a gate crossing over the active region and on top of a middle of the active region; and
    doping a plurality of carriers in a first section bounded by the gate and the isolation layer to form a drain in the first section and a second section bounded by the gate and the isolation layer to form a source in the second section;
    wherein a minimum width of the protrusion is greater than a width of the gate.

8. The method of claim 7, wherein a length of the protrusion protruded from the rectangular area is equal to the width of the gate.

9. The method of claim 7, wherein the width of the protrusion is no greater than two times the width of the gate.

10. The method of claim 7, wherein a shape of the protrusion comprises a rectangle and/or a bow.

11. The method of claim 7, wherein the gate is formed directly above the at least one protrusion, or a little bit shifted to right or left of a position directly above the at least one protrusion.

12. The method of claim 7, wherein the active region has two protrusions protruded from two opposite edges of the rectangular area, making a shape of the active region a symmetrical cross.

13. A field effect transistor comprising:
    a substrate comprising an active region having a rectangular area and at least one protrusion protruded from the rectangular area, wherein corners of the rectangular area and corners of the at least one protrusion are rounded;
    an isolation layer formed on the substrate and encircling the active region, wherein corners of the isolation layer are rounded;
    a gate crossing the active region and formed above a middle portion of the active region;
    a channel formed in the active region directly under the gate, extending to the at least one protrusion, and dividing the active region into a first section and a second section;
    a drain formed in the first section; and
    a source formed in the second section.

14. The field effect transistor of claim 13, wherein a length of the protrusion protruded from the rectangular area is equal to a width of the gate.

15. The field effect transistor of claim 13, wherein a width of the protrusion is one to two times a width of the gate.

16. The field effect transistor of claim 13, wherein the gate is formed directly above the at least one protrusion, or a little bit shifted to right or left of a position directly above the at least one protrusion.

17. The field effect transistor of claim 13, wherein the active region has two protrusions protruded from two opposite edges of the rectangular area, making a shape of the active region a symmetrical cross.

* * * * *